United States Patent [19]

Menkhoff

[11] Patent Number: 5,714,918
[45] Date of Patent: Feb. 3, 1998

[54] EQUALIZER FOR DIGITIZED SIGNALS

[75] Inventor: Andreas Menkhoff, Freiburg, Germany

[73] Assignee: Deutsche ITT Industries, GmbH, Freiburg, Germany

[21] Appl. No.: 696,032

[22] Filed: Aug. 9, 1996

[30] Foreign Application Priority Data

Aug. 12, 1995 [EP] European Pat. Off. ............ 95 11 2740

[51] Int. Cl.[6] ......................................... H03H 7/03
[52] U.S. Cl. .................. 333/28 R; 333/28 T; 333/166; 381/98
[58] Field of Search ......................... 333/18, 28 R, 333/28 T, 166; 375/229; 381/98, 103, 104

[56] References Cited

U.S. PATENT DOCUMENTS 5,371,803 12/1994 Williamson, III ..................... 381/104

OTHER PUBLICATIONS

Tunable Digital Frequency Response Equalization Filters, by Regalia et al., IEEE Transactiions On Acoustics, Speech, and Signal processing, vol. ASSP-35, No. 1, Jan. 1987, pp. 118–120.

On The Design Of Nonlinear Phase Quadrature Mirror Filter (QMF) For Subband Coder Applications, by Kumar, Proceedings of the 1987 IEEE Region 10 Conference, TENCON 87, Computers And Communications Technology Toward 2000, Aug. 25–28, 1987, pp. 945 to 947.

Design Of Nearly Perfect Non Uniform QMF Filter Banks, by Charbonnier et al., International Conference On Acoustics, Speech, and Signal Processing, 1988, vol. III, Digital Signal Processing, pp. 1786 to 1789 no month.

*Primary Examiner*—Paul Gensler
*Attorney, Agent, or Firm*—Plevy & Associates

[57] ABSTRACT

In an equalizer with n number of frequency ranges for digitized signals in which by means of n–1 cascaded filter circuits containing parallel connected digital low-pass filters and digital high pass filters whose respective frequency responses are linked by complementary transfer functions. A desired amplitude response is implemented via an increase or decrease in the amplitudes of adjacent frequency ranges in the associated filter circuit by weighting the outputs of the digital high-pass and low-pass filters, and a control unit forms the respective weighting factor from an equalizer control signal which contains the desired amplitude response as information.

16 Claims, 4 Drawing Sheets

EQUALIZER FOR DIGITIZED SIGNALS

FIELD OF THE INVENTION

This invention relates to digital circuits and more particularly to an equalizer for digitized signals.

BACKGROUND OF THE INVENTION

The present invention relates to an equalizer for digitized signals which has a number of adjacent frequency ranges in which the applied signal is to be arbitrarily adjustable in amplitude within predetermined limits. Such circuits are used, in more or less complex form, as tone controls in audio equipment. Originally they processed only analog signals. Equalizers are employed wherever variable, frequency-dependent level control is desired. In the video signal range, for example, an equalizer permits an enhancement of the performance of an image transmission system or an image enhancement by increasing or decreasing the magnitude of particular video-frequency ranges. With increasing digitization of the signal-processing circuitry, such equalizers are also implemented in digital technology. Complicated and costly solutions are digital filter banks which split the applied digital signal into individual frequency ranges by means of a multitude of digital bandpass filters and produce the desired amplitude response by individual amplification of the bandpass-filtered signals. Such a filter bank with variable bandpass filters for a digital equalizer is described, for example, in an article by P. A. Regalia and S. K. Mitra, "Tunable Digital Frequency Response Equalization Filters", IEEE Transactions on Acoustics, Speech, and Signal Processing, Vol. ASSP-35, No. 1, January 1987, pages 118 to 120. The bandwidth of the bandpass filters used therein and their slope steepness are determined by the respective filter order and quality factor (Q) which follow from the requirements placed on the equalizer. The desired modification of the frequency response is then obtained by increasing or decreasing the response of the individual bandpass filters.

Difficulties arise with this type of equalizer because of the generally unsatisfactory selectivity of the bandpass filters used. If, for example, the bandwidth of the individual bandpass filters is chosen to be relatively narrow and their Q relatively high (see curve vb in FIG. 2, which corresponds to a Q of 0.8), the mutual overlap of the responses of adjacent bandpass filters will be small. This has the disadvantage, however, that if the magnitudes of two adjacent frequency ranges are increased or decreased together, the amplitude response in this range will not be flat but will exhibit an unwanted dip or an unwanted amplification in the intermediate range. If the bandwidth of the individual bandpass filters is chosen to be relatively wide and their Q relatively small (see curve va in FIG. 2, which corresponds to a Q of 0.2), the undesirable dip can be avoided. In that case, however, new difficulties arise. Through the wide width and low Q of the bandpass filters, the effect of the latter is no longer limited to the respective frequency range but also affects the adjacent ranges. The result is, for example, that if the frequency responses of adjacent bandpass filters are jointly increased to 12 dB, a large overlap region will occur in which the two filter curves are superposed, so that in this overlap region the amplification will be significantly increased (in FIG. 2, instead of the desired 12 dB, approximately 17 dB are reached there). In practice, therefore, a trade-off between these two limits is required in conventional equalizers.

Through the choice of steep bandpass filters, which, however, are very computation-intensive and thus require a considerable amount of circuitry, this conflict can be mitigated. For many applications in the consumer sector, which also includes personal computers for multimedia service or other digital signal-processing circuits, an efficient, but less costly solution for a digital equalizer is needed which, in particular, is suitable for monolithic integration in a digital signal-processing circuit.

It is, therefore, an object of the invention to provide an improved circuit for a digital equalizer whose frequency ranges can be increased or decreased in magnitude as accurately as possible in accordance with the predetermined amplitude response, with as smooth a transition as possible, without overshoot or gaps, taking place in the intermediate ranges.

SUMMARY OF THE INVENTION

According to the features of claim 1, this object is attained for an equalizer with n frequency ranges for digitized signals as follows:

The equalizer with n frequency ranges for digitized signals comprises n−1 cascaded filter circuits comprising digital low-pass filters and digital high-pass filters with which a desired amplitude response is adjusted, with the skirts of the selectivity curves of the digital low-pass and high-pass filters defining the frequency limit between adjacent frequency ranges; each of the n−1 filter circuits contains, in the direction of signal flow, a parallel circuit with one of the digital low-pass filters and one of the digital high-pass filters, the respective frequency responses of said digital low-pass and high-pass filters being linked by complementary transfer functions, and their outputs being interconnected via a combining stage; a relative increase or decrease in amplitude in the direction of ascending frequencies between adjacent frequency ranges is effected in the associated filter circuit by weighting the outputs of the digital high-pass and low-pass filters; for the relative increase in amplitude, the output signals from the digital high-pass filter are assigned a greater weight than those from the digital low-pass filter, and for the relative decrease in amplitude, the output signals from the digital low-pass filter are assigned a greater weight than those of the digital high-pass filter; and the weighting is adjusted by a control unit which forms modified control signals from an applied equalizer control signal according to the cascading of the filter circuits.

By means of such an equalizer, the amplitude response selected by the user can be approximated much more accurately than has been possible with conventional equalizer circuits using parallel-connected, independent bandpass filters. The equalizer according to the invention is based on interdependent, cascaded filter circuits. Each of the filter circuits comprises a low-pass filter and a high-pass filter with complementary transfer functions, with the passband gain of the respective filter, unlike the stop-band attenuation, being adjustable. Through the cascading of the filter circuits, the absolute level of each frequency range is dependent on all the preceding and subsequent filter circuits. For an equalizer with n frequency bands, n−1 cascaded filter circuit or filter elements are generally needed. The interdependence of the individual filter circuits complicates the adjustment of the desired amplitude response although the associated algorithm is simple, so that such a method is unsuitable, particularly for a purely manually controlled equalizer. If the equalizer is realized using monolithic integrated circuit technology, however, the simple algorithm for adjusting the desired amplitude response can be easily automated, i.e., implemented as a small subprogram.

BRIEF DESCRIPTION THE DRAWINGS

The invention and referred embodiments thereof wild now be explained in more detail with reference to the accompanying drawings, in which like parts or signals are designated by like reference characters, and in which.

DETAILED DESCRIPTION OF THE INVENTION

Figure 1:
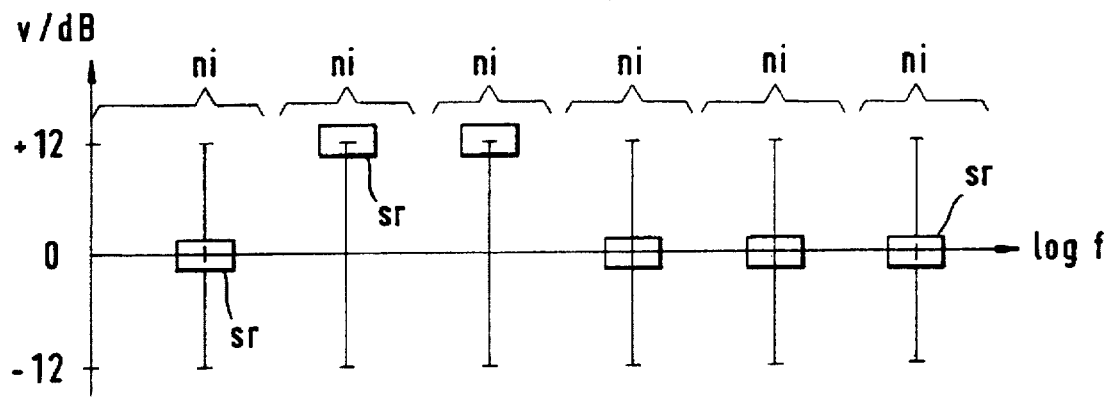
FIG. 1 shows schematically a manual adjusting device for an equalizer.

FIG. 1 shows schematically a manual adjusting device for an equalizer for audio signals. It contains six slider controls sr which are assigned to one frequency range ni each. In conventional analog or digital equalizers, this frequency range ni is determined by a bandpass filter whose passband gain can be adjusted by means of the slider control or independently of the other bandpass filters. Since the sensitivity of the ear has a logarithmic characteristic, the same characteristic is used for the slider controls, whereby the usual decibel (dB) adjustment is obtained. In FIG. 1, the position of all slider controls sr thus corresponds to the desired amplitude response vs of the equalizer shown in FIG. 2.

For the sake of clarity, the amplitude responses and the frequency axes are shown in all following diagrams logarithmically, the individual frequency ranges ni having logarithmically equal widths. This is not absolutely necessary, however, and can hardly be met, particularly in the case of digital filter banks, which are implemented using a Fast Fourier Transform (FFT) technique, for example. In such filter banks, the individual filter ranges ni generally have equal bandwidths in the absolute frequency scale. Since in the case of audio signals a logarithmic dependence also applies for the subjective frequency impression, a constant bandwidth in the absolute frequency scale is undesirable for the bandpass filters. Through the use of high-pass or low-pass filters, the frequency limits of the individual frequency ranges ni can be arbitrarily preset in a simple manner, so that an optimum division of the entire frequency range is possible for the equalizer according to the invention. A further degree of freedom is obtained if, in addition, the frequency limit in some of the filter circuits is variable.

Figure 3:
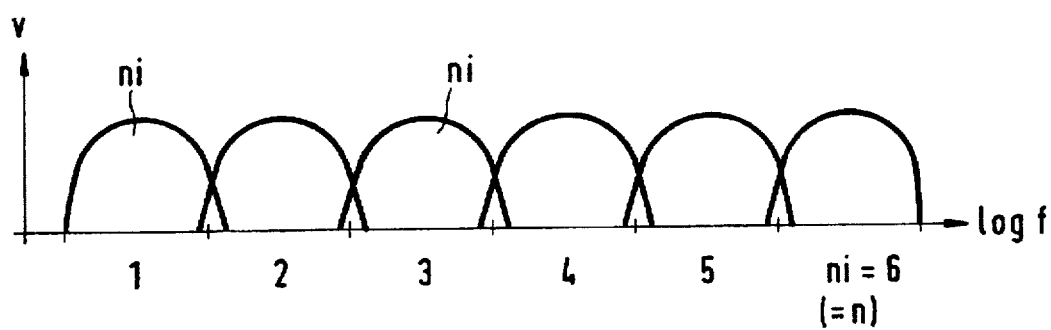
FIG. 3 shows schematically the frequency ranges belonging to FIGS. 1 and 2.

FIG. 3 shows schematically six frequency ranges ni from 1 to 6 formed with bandpass filters adjusted with the adjusting device of FIG. 1. The individual gains are equal, so that the amplitude response v is flat except for a small ripple. In conventional equalizers with bandpass filters, this flat characteristic applies only for the 0 dB setting. For all other levels, even if they are equal, this does not apply, because increases or decreases in amplitude are then caused in the intermediate ranges. With an equalizer according to the invention, however, a joint increase or decrease in amplitude will have no effect on the relative frequency response but will correspond to a frequency-neutral gain adjustment. In audio applications, this corresponds to volume control without frequency distortion. In FIG. 3, the individual filter ranges ni overlap slightly.

Figure 2:
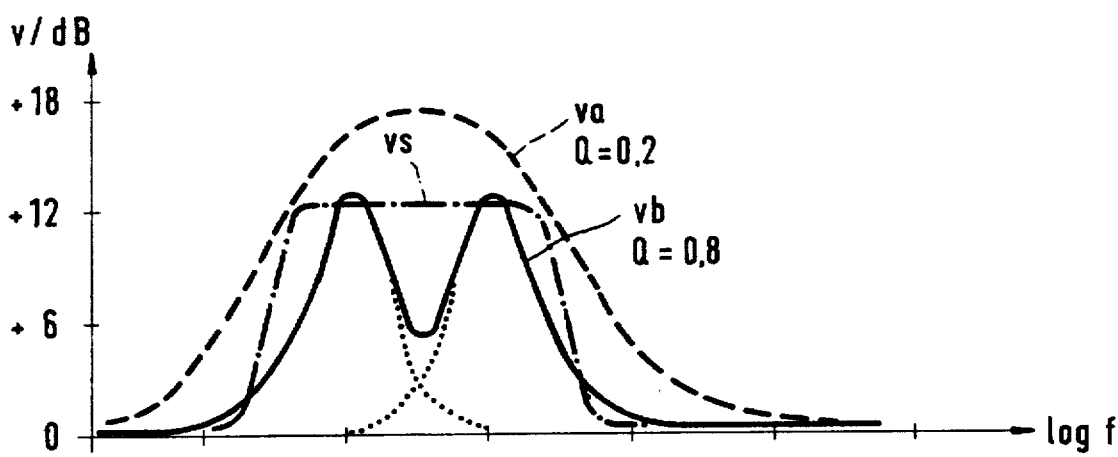
FIG. 2 shows examples of desired and undesired amplitude responses.

FIG. 2 shows schematically the amplitude response v as a dB characteristic for an equalizer setting according to FIG. 1. The amplitude response vb corresponds to bandpass filters with a relatively high Q of 0.8. It can be seen that in frequency ranges 2 and 3 (see FIG. 3) the desired 12 dB is reached at the maximum, but because of the high Q of the bandpass filters, considerable ripple is present, which results in a desired amplitude reduction between frequency ranges 2 and 3. The amplitude response va is based on low Q bandpass filters, namely filters with a Q of 0.2, whereby the ripple is avoided. As a result of the low Q, however, the individual frequency ranges ni are no longer independent of each other, but an unwanted superposition of adjacent frequency ranges takes place. Thus, the amplitude response va increases to 17 dB between frequency ranges 2 and 3, exceeding the set level of 12 dB considerably. A good approximation to the desired amplitude response of FIG. 1 is represented by the dash-and-dot line vs, which has exactly a level of 12 dB for the frequency ranges 2 and 3 and assumes the value 0 dB for the other frequency ranges, the transitions being smooth and as narrow as possible. The invention makes this amplitude response vs possible.

Figure 4:
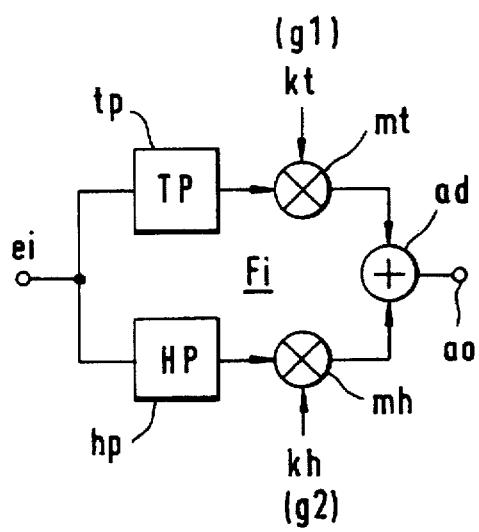
FIG. 4 is a block diagram of a filter circuit according to the invention.

FIG. 4 shows the basic structure of a filter circuit Fi for an equalizer according to the invention in a block diagram. Each filter circuit forms one stage of the overall filter arrangement, and defines a frequency limit fg. To control the amplitude response v, this filter circuit Fi uses the parallel combination of a low-pass filter tp and a high-pass filter hp whose frequency responses are such that, if the low-pass filter and the high-pass filter have equal gains, as flat an amplitude response v as possible will result for the parallel combination. That will be the case if the frequency responses of the low-pass filter and the high-pass filter are linked by complementary transfer functions. In the simplest case, the low-pass filter will have the transfer function $h(tp)=g1 \cdot (1+z^{-1})/2$, and the high-pass filter will have the transfer function $(h(hp)=g2 \, (1-z^{-1})/2$. The factors g1, g2 are weighting factors. If these are equal, i.e., if g1=g2=g, the following relation holds for the addition of the two transfer functions "h"=h(tp)+h(hp): "h"=g $(1+z^{-1})/2$+g $(1-z^{-1})/2$=g This means that if a suitable low-pass filter and a suitable high-pass filter are connected in parallel, the resulting amplitude response will be flat and the weighting factor g will correspond to a uniform gain level of the digital signal at the output of the parallel circuit. The resulting transfer function "h" thus has no influence on the digital signal except that the amplitude may be changed by the weighting factor.

If more complex low-pass and high-pass filters are used, the skirts of the response curves of the low-pass filter and the high-pass filter become steeper, with the overall amplitude response remaining maximally flat with unchanged weighting factors. Such complementary transfer functions are described in detail in a book by P. P. Vaidyanathan, "Multirate Systems and Filter Banks", in Chapter 5, "Maximally Decimated Filter Banks", pages 188 to 285. As is stated in the introduction to that chapter, Sections 5.0 to 5.02 on pages 188 to 191, it has long been known, for example, that digitized signals can be split in frequency by means of a low-pass filter and a high-pass filter and subsequently recombined without signal loss. In Anglo-Saxon usage, such filter combinations are also referred to as "power symmetric filter banks", "power complementary filter banks", "quadrature mirror filter banks" or "QMF banks" for short, or as "power symmetric QMF banks". In none of the filter circuits according to the invention, does sampling-rate conversion takes place as in the filter examples of the cited literature, because this would cause distortion due to alias signals as a result of the cascading in the equalizer.

In FIG. 4, the filter circuit Fi is supplied at the input ei with a digital signal which either is directly the original input signal or comes from a preceding filter circuit Fi. As a rule, the bandwidth of the low-pass filter tp or the high-pass filter hp has no effect on the value of the digital signal, so that in the passbands a gain of 0 dB can be assumed. This corresponds to the amplitude responses vt and vh in FIG. 5. In such a lowpass or high-pass filter, the desired increase or decrease in the magnitude of the signal is achieved by a multiplier mt succeeding the low-pass filter tp and a multiplier mh succeeding the high-pass filter hp. The respective multiplication-factor inputs are fed with the weighting factors g1 and g2 as multiplication factors, namely the multiplication factor kt for the low-pass branch and the multiplication factor kh for the high-pass branch. The filter circuits Fi may, of course, be implemented in hardware or software or even in mixed form. The multipliers mt and mh may also form part of the low-pass filter and high-pass filter, respectively, in which case their amplitude responses v in the passband will no longer be 0 dB but will correspond to the multiplication factors kt and kh, respectively. In FIG. 4, the outputs of the low-pass and high-pass signal branches are recombined by means of a combination stage, in the simplest case an adder ad. The output signal of the latter appears at an output ao and is fed to a subsequent filter circuit Fi or transferred to a data or signal output of the equalizer.

From the above-mentioned book by P. P. Vaidyanathan, Chapter 3.6, "IIR Filters Based on two Allpass Filters", pages 84 to 99, digital QMF banks are known which are especially suitable for implementing the complementary transfer functions of the low-pass and high-pass filters. They contain, instead of a low-pass filter and a highpass filter, two filter subcircuits connected in parallel at the input end, whose outputs are added and subtracted to obtain the low-pass signal and high-pass signal, respectively. Each of the two filter circuits consists of a digital allpass filter, but these filters have different phase responses. Instead of the subtraction, an addition of the two output signals may, of course, be performed, in which case the output of the second filter subcircuit must be negated ahead of the associated adder. The implementation of a complementary low-pass/high-pass filter pair with such allpass filters is particularly simple since the arithmetic operations for the low-pass filter must only be supplemented with a single subtraction to obtain the complementary high-pass filter. Thus, if such allpass filters are used for the equalizer, only low-pass filters have actually to be computed, which, in addition, are easy to implement. Conventional equalizers require genuine band-pass filters, whose computation is substantially more complex with comparable quality. The signals in the low-pass and high-pass branches are weighted by a respective multiplier after the adder and the subtracter or after the two adders.

Figure 5:
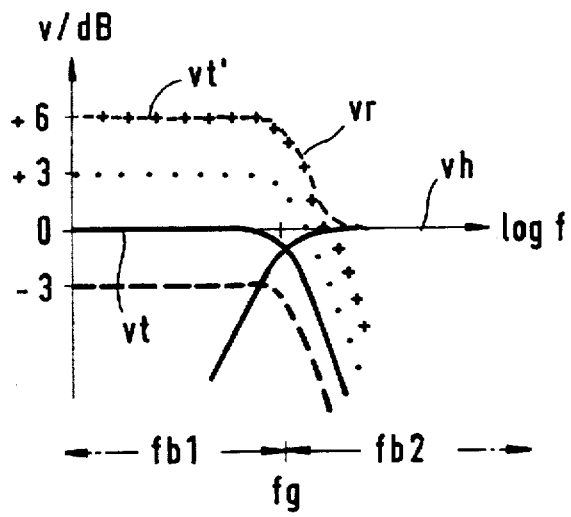
FIG. 5 shows a few amplitude responses for the circuit of FIG. 4.

FIG. 5 shows schematically the amplitude response vt of the low-pass filter tp and the amplitude response vh of the high-pass filter hp. For the low-pass filter, additional amplitude responses are shown for the weighting factors g1=+6 dB, +3 dB, and −3 dB. The associated frequency limit fg divides the entire frequency range into a first, lower frequency range fb1 and a second, higher frequency range fb2, the first frequency range fb1 being assigned to the passband of the low-pass filter tp and the second frequency range fb2 to the passband of the high-pass filter hp. In the example of the low-pass signal amplified by +6 dB, the associated amplitude response vt' is combined with the amplitude response vh of the unamplified high-pass filter to obtain a resulting amplitude response vr. The latter has a level of +6 dB in the first frequency range fb1 and a level of 0 dB in the second frequency range fb2. The skirt of the response curve has slightly shifted from the original frequency limit fg toward higher frequencies.

From FIG. 5 it is apparent that two frequency ranges ni can be level-controlled with a single filter circuit Fi. A level increase or decrease in the low-pass signal branch influences the level of the first frequency range fb1, and a level increase or decrease of the high-pass filter hp influences the level of the second frequency range fb2. Thus, any desired amplitude response can be set by skillful combination of several filter circuits Fi.

Figure 6:
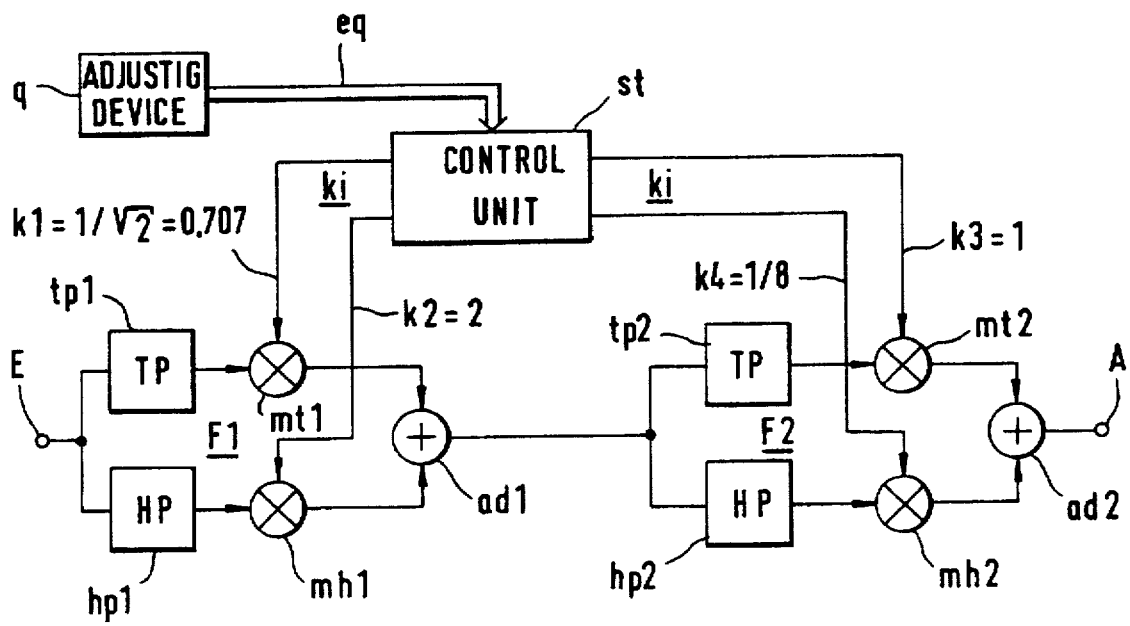
FIG. 6 shows an embodiment of an equalizer with two filter circuits.

FIG. 6 shows a complete block diagram of an equalizer according to the invention for three frequency ranges ni from 1 to 3. The three frequency ranges ni require two filter circuits F1, F2 which are connected in cascade and each comprises a low-pass filter tp1, tp2 and a high-pass filter hp1, hp2. The input of the first filter circuit F1 is connected to the data input E of the equalizer, and the output of the second filter circuit F2 is connected to the data output A of the equalizer. An adjusting device q for the equalizer, which may contain, for example, a manual adjusting device as shown in FIG. 1, provides at its output an equalizer control signal eq to a control unit st. The equalizer control signal contains the desired amplitude response in coded form, the coding being determined, for example, by the respective positions of the slider controls sr. In multimedia and similar applications, the equalizer control signal eq is generated differently, of course, e.g., via a menu control on the screen or automatically via a stored setting.

Figure 7:
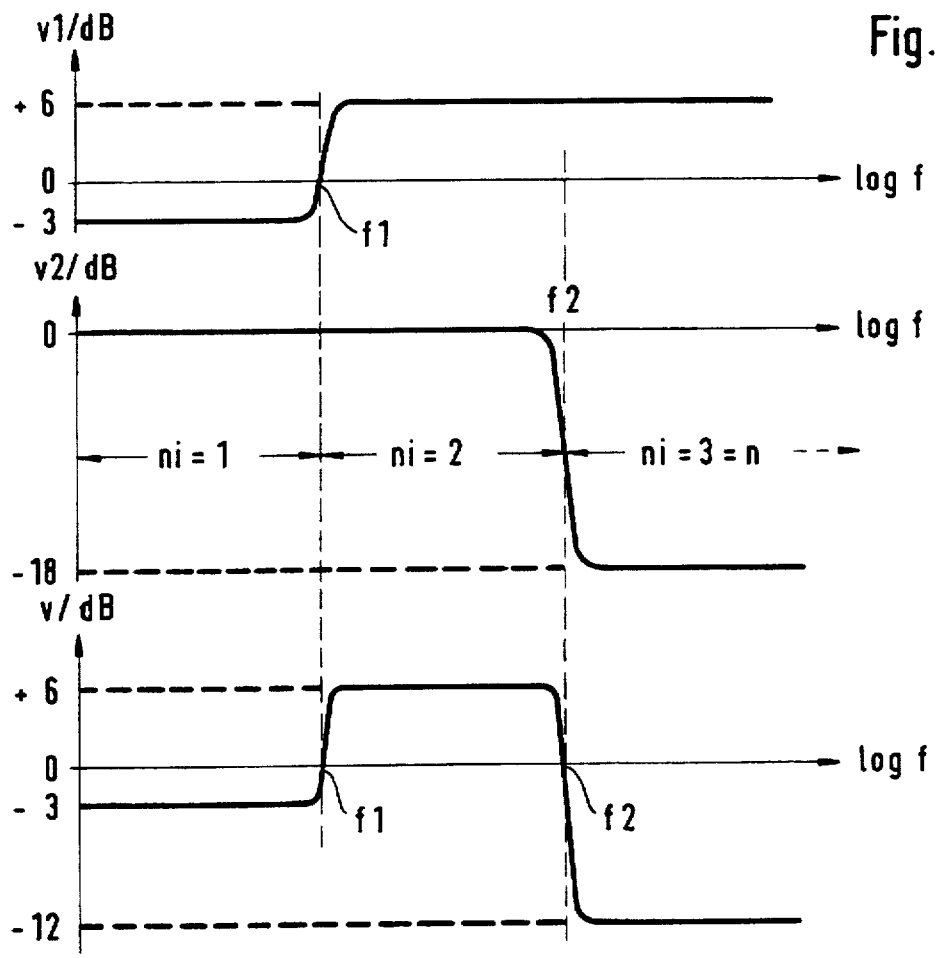
FIG. 7 shows a few amplitude responses for the circuit of FIG. 6.

The control unit st contains the algorithm for converting the equalizer control signal eq into modified control signals ki, which ultimately represent the individual multiplication factors k1 to k4. The algorithm is particularly simple and clear if the desired levels of the first and second frequency ranges 1, 2 are precisely set by the amplitude response v1 of the first filter circuit F1, while the second filter circuit F2 only has to implement the relative level change by 18 dB between the second and third frequency ranges 2 and 3, which is done by means of the amplitude response v2. The amplitude responses v1, v2, and v are shown in FIG. 7. By setting the low-pass branch in the second filter circuit F2 to 0 dB, the problem of mathematical over-determination of the four multiplication factors k1 to k4 from only three level values −3 dB, +6 dB, and −6 dB is solved as well. This will be considered in more detail in connection with FIGS. 9 and 10.

The desired level values of the amplitude response v of the equalizer give the individual multiplication factors: $k1=-3$ dB=0.707 in the low-pass branch in the first filter circuit F1, $k2=+6$ dB=2 in the high-pass branch in the first filter circuit F1, $k3=0$ dB=1 in the low-pass branch in the second filter circuit F2, and $k4=-18$ dB=⅛ in the high-pass branch in the second filter circuit F2.

The signals are combined in the first and second filter circuits F1 and F2 by means of a first adder ad1 and a second adder ad2, respectively. The order of the individual filter circuits Fi between the data input E and the data output A is arbitrary, even with an arbitrary number of filter circuits Fi.

In the embodiment of FIG. 6 it can also be readily seen that for each frequency range ni the resulting level of the amplitude response v follows from the weighting or multiplication factors of the associated low-pass and high-pass filters. The product of the associated multiplication factors provides the resulting level for the respective frequency range ni. An "associated multiplication factor in the respective frequency range" means that multiplication factor which is assigned to the passband of either the low-pass filter or the high-pass filter in this range. The other multiplication factor, which is assigned to the associated stop band, is left out of account. Thus, the following products apply for the three frequency ranges shown in FIGS. 6 and 7: first frequency range with ni=1: k1 k3=1/(SQR2)·1=0.707=−3 dB, second frequency range with ni=2:k2 k3=2·1=2=+6 dB, and the third frequency range with ni=3:k2·k4=2·⅛=0.25=−12 dB.

Figure 8:
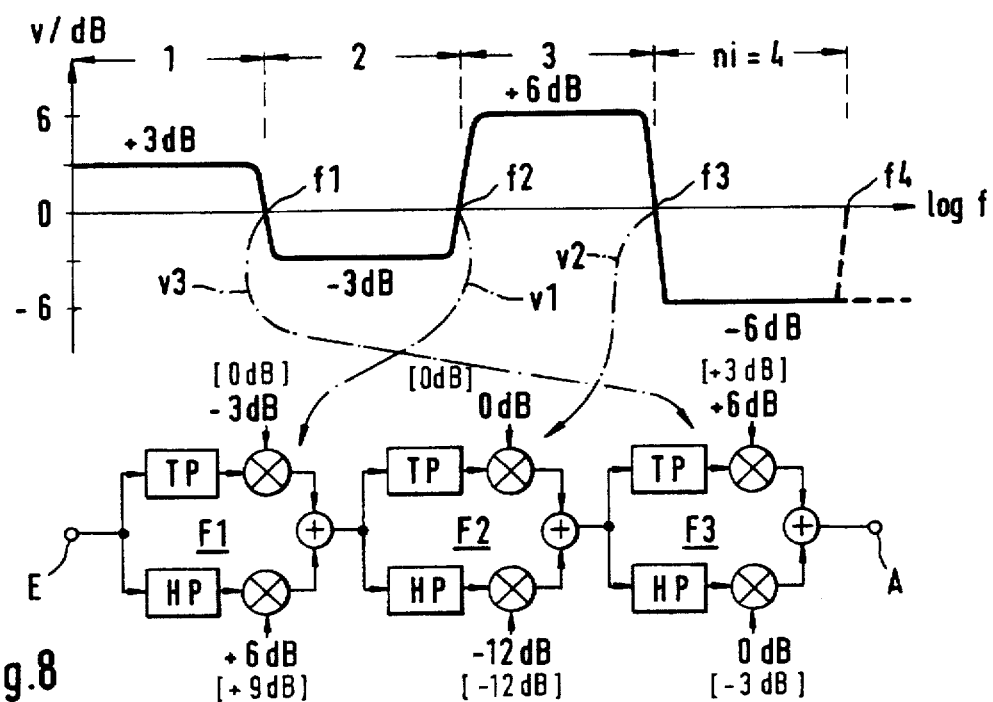
FIG. 8 shows schematically an equalizer with three filter circuits.

FIG. 8 shows schematically an embodiment of an equalizer with four frequency ranges which, according to the invention, requires three filter circuits F1, F2, F3. Unlike in FIG. 7, the individual multiplication factors are formed in a different order. The first filter circuit F1, accepts not the desired levels of the first frequency limit f1, but those of the second frequency limit f2. The low-pass branch is weighted with −3 dB (second frequency range), and the high-pass branch with +6 dB (third frequency range). The associated amplitude response v1 of the first filter circuit F1 is shown in FIG. 9.

The second filter circuit F2 is assigned to the third and fourth frequency ranges at the third frequency limit f3. Since the third frequency range already has its correct value, namely +6 dB, this value must not be changed, so that the low-pass branch in the second filter circuit F2 is assigned the weighting factor 0 dB. The high-pass branch must implement the relative level change between +6 dB and −6 dB, so that it is assigned the weight −12 dB, the resulting amplitude response v2 is also shown in FIG. 9.

Now there only remains the level change from +3 dB to −3 dB at the first frequency limit f1, which is implemented with the third filter circuit F3. Since the level of the second frequency range already has its desired value, namely −3 dB, this value must not be changed, so that the high-pass branch of the third filter circuit F3 is assigned the weight 0 dB. The associated low-pass branch must, in the ascending frequency direction, implement an amplitude reduction from +3 dB to −3 dB at the first frequency limit F1, which corresponds to a relative level change by −6 dB. This is achieved by setting the weight of the low-pass branch of the third filter circuit F3 to +6 dB.

Figure 9:
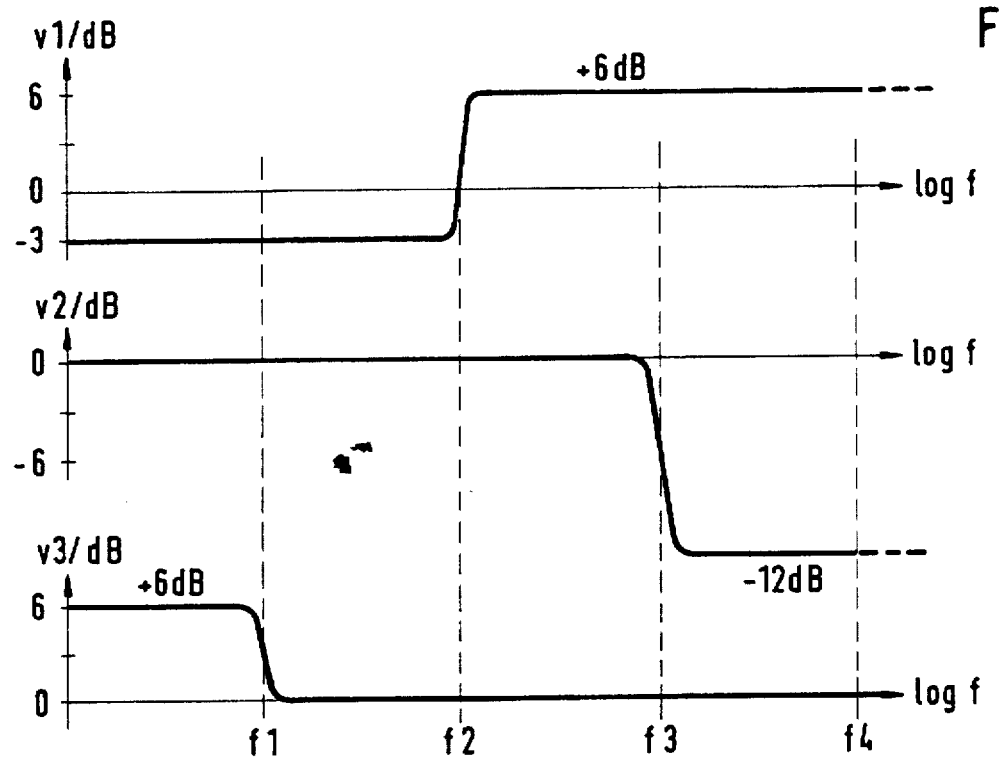
FIGS. 9 and 10 show a few amplitude responses for the circuit of FIG. 8.
Figure 10:
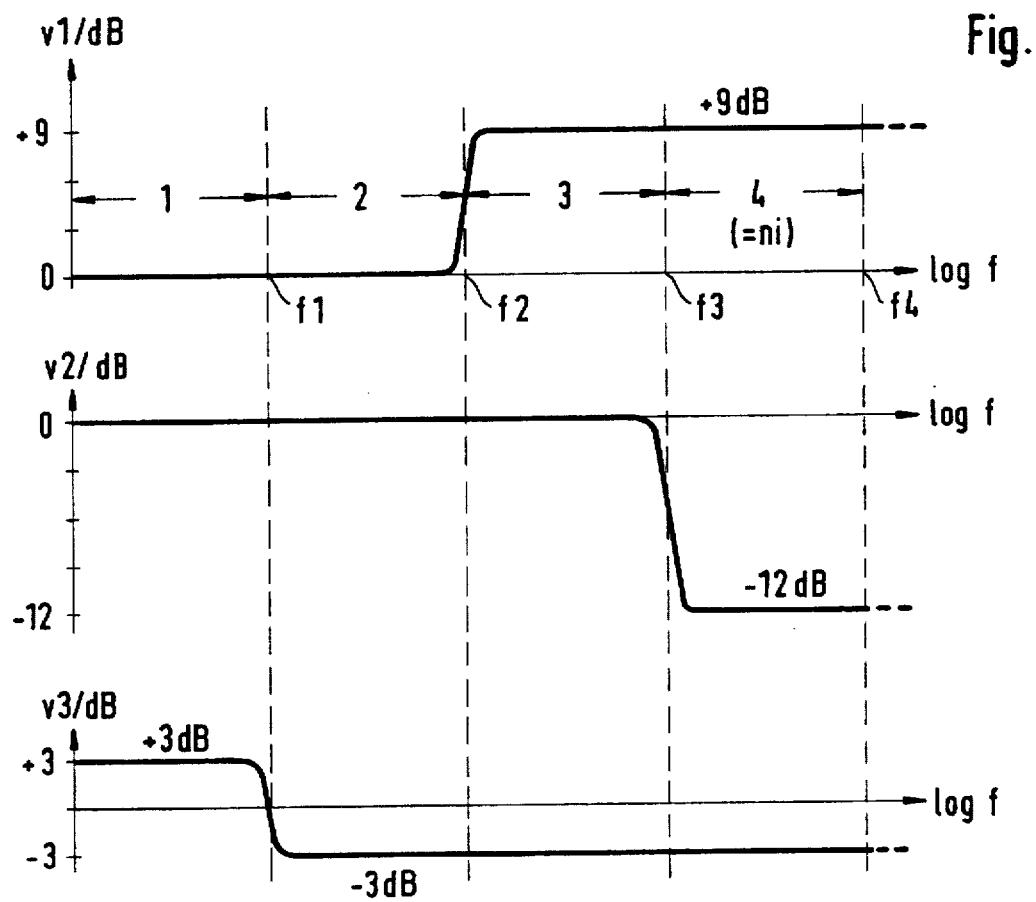

The desired and resulting amplitude response v of the equalizer is shown in the upper part of FIG. 8, while FIG. 9 shows the associated amplitude responses v1, v2, v3 of the three filter circuits F1, F2, F3. For the sake of clarity, no control unit is shown in FIG. 8 and the respective multiplication factors are given as dB values. For each weighting factor, a bracketed alternative is given in FIG. 8 which also results in the desired amplitude response v. The associated amplitude responses v1, v2, v3 of the three filter circuits F1, F2, F3 are shown in FIG. 10. A comparison between the amplitude responses of FIG. 7 and FIG. 10 shows that the magnitudes and directions of the relative level changes are equal. The amplitude responses v1, v3 differ by a constant level shift of +3 dB and −3 dB.

In FIG. 8, like in FIG. 6, the six multiplication factors, which must be calculated from four desired levels +3 dB, −3 dB, +6 dB, and −6 dB, are over-determined. Therefore, there is an infinite number of different solutions which differ only in the DC level, but not in the basic curve shape. Mathematically, these solutions are equivalent, but during practical implementation, problems may arise from the fact that the inner dynamic range, i.e., the internal number of bits, exceeds any reasonable measure, and that unnecessary level changes increase the digitization noise. It is therefore appropriate to begin with the absolute low-pass/high-pass filter setting where the subjective sensitivity is the greatest, as in FIG. 9, i.e., at approximately 3000 hertz in the case of audio signals. From there, one works his way forward in both frequency directions, leaving the frequency ranges not to be changed at 0 dB. In this manner, unnecessary level switching is avoided. The embodiment of FIG. 10 is not optimal, because in the third frequency range ni=3, the weighting factors +9 dB and −3 dB meet one another to eventually form a resulting level of +6 dB.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. An equalizer with a predetermined number of frequency ranges for digitized signals wherein a desired amplitude response is adjusted by means of a predetermined number of cascaded filter circuits comprising digital low-pass filters and digital high-pass filters, with the skirts of the selectivity curves of the digital low-pass and high-pass filters defining the frequency limit between adjacent frequency ranges;

each of the predetermined number of filter circuits contains, in the direction of signal flow, a parallel circuit with one of the digital low-pass filters and one of the digital high-pass filters, the respective frequency responses of said digital low-pass and high-pass filters being linked by complementary transfer functions, and their outputs being interconnected via a combining stage;

wherein a relative increase or decrease in amplitude in the direction of ascending frequencies between the adjacent frequency ranges is effected in the associated filter circuit by weighting the outputs of the digital high-pass and low-pass filters;

for the relative increase in amplitude, the output signals from the digital high-pass filter are assigned a greater weight than those from the digital low-pass filter, and for the relative decrease in amplitude, the output signals from the digital low-pass filter are assigned a greater weight than those of the digital high-pass filter; and, the weighting is adjusted by a control unit which forms modified control signals from an applied equalizer control signal according to the cascading of the filter circuits.

2. An equalizer in accordance with claim 1, wherein the control unit forms the individual weights as multiplication factors by which the output signals from the digital low-pass and high-pass filters have to be multiplied, and in each one of the frequency ranges, the product of the associated weights corresponds to the designed level value of the amplitude response.

3. An equalizer in accordance with claim 2, wherein in the passbands of the digital low-pass and high-pass filters, the respective internal gains of the latter equal unity, and the output gain of each of the low-pass and high-pass filters is adjustable by means of an associated multiplier whose multiplication-factor input is supplied with the associated multiplication factor as the control signal.

4. An equalizer in accordance with claim 1, wherein the digital low-pass and high-pass filters are implemented as a quadrature mirror filter bank.

5. An equalizer in accordance with claim 2, wherein the digital low-pass and high-pass filters are implemented as a quadrature mirror filter bank.

6. An equalizer in accordance with claim 3, wherein the digital low-pass and high-pass filters are implemented as a quadrature mirror filter bank.

7. An equalizer in accordance with claims 1, wherein that in at least one of the filter circuits, the multiplication factor for at least one of the digital low-pass filter and the digital high-pass filter has the value 1.

8. An equalizer in accordance with claims 2, wherein that in at least one of the filter circuits, the multiplication factor for at least one of the digital low-pass filter and the digital high-pass filter has the value 1.

9. An equalizer in accordance with claims 3, wherein that in at least one of the filter circuits, the multiplication factor for at least one of the digital low-pass filter and the digital high-pass filter has the value 1.

10. An equalizer in accordance with claims 4, wherein that in at least one of the filter circuits, the multiplication factor for at least one of the digital low-pass filter and the digital high-pass filter has the value 1.

11. An equalizer in accordance with claims 5, wherein that in at least one of the filter circuits, the multiplication factor for at least one of the digital low-pass filter and the digital high-pass filter has the value 1.

12. An equalizer in accordance with claims 6, wherein that in at least one of the filter circuits, the multiplication factor for at least one of the digital low-pass filter and the digital high-pass filter has the value 1.

13. The equalizer in accordance with claim 1, wherein the predetermined number of filter circuits is one less than the number of predetermined frequency ranges.

14. The equalizer in accordance with claim 1, wherein the predetermined number of frequencies ranges is two, which can be level controlled with a single filter circuit.

15. The equalizer in accordance with claim 14, wherein one of the two frequency ranges is level controlled by a signal from the digital low pass filter of the single filter circuit.

16. The equalizer in accordance with claim 15, wherein the other of the two frequency ranges is level controlled by a signal from the digital high pass filter.

* * * * *